United States Patent
Bauer et al.

[19]

[11] Patent Number: 5,814,765
[45] Date of Patent: Sep. 29, 1998

[54] WATERPROOF HOUSING WITH A PLUG-AND-SOCKET CONNECTION FOR PROTECTION ELECTRONIC CIRCUIT

[75] Inventors: Peter Bauer, Regensburg; Josef Dirmeyer, Bodenwöhr; Christian Plankl, Burgweinting, all of Germany; Rony Van Houdenhove, Ruiselede, Belgium

[73] Assignee: Siemens Aktiengesellschaft, Munich, Germany

[21] Appl. No.: 790,320

[22] Filed: Jan. 28, 1997

[51] Int. Cl.⁶ .................................................. H01J 5/32
[52] U.S. Cl. .................... 174/50.54; 220/4.02; 439/76.1; 361/658
[58] Field of Search ................................ 174/52.3, 50.54, 174/50.53, 50.52, 52.4, 17.05; 220/3.8, 4.02, 3.3; 361/641, 658, 640; 439/76.1, 701, 906

[56] References Cited

U.S. PATENT DOCUMENTS

| | | | |
|---|---|---|---|
| 4,225,748 | 9/1980 | Buck et al. | 174/52.1 |
| 4,654,470 | 3/1987 | Feldman et al. | 174/50 |
| 4,709,297 | 11/1987 | Walther | 361/212 |
| 5,436,407 | 7/1995 | Fehr et al. | 174/52.4 |

FOREIGN PATENT DOCUMENTS

| | | |
|---|---|---|
| 87 00 213.2 | 6/1987 | Germany . |
| 36 35 165 A1 | 4/1988 | Germany . |
| 37 28 456 A1 | 3/1989 | Germany . |
| 40 33 963 A1 | 4/1992 | Germany . |
| 41 06 077 A1 | 9/1992 | Germany . |
| 42 40 727 C1 | 2/1994 | Germany . |
| 43 38 250 A1 | 6/1994 | Germany . |
| 43 29 980 A1 | 10/1994 | Germany . |

OTHER PUBLICATIONS

Patent Abstracts of Japan No. 8021666 (Hideki) dated Jan. 28, 1994.

Primary Examiner—Kristine L. Kincaid
Assistant Examiner—Dhiru R. Patel
Attorney, Agent, or Firm—Herbert L. Lerner; Laurence A. Greenberg

[57] ABSTRACT

A waterproof housing with a plug-and-socket connection for protecting electronic circuits includes a hard plastic upper part and a hard plastic lower part. A soft plastic extruded seal is disposed between the upper part and the lower part. A plug part is constructed in one piece with the upper or lower part. The plug part has a hard plastic inner part containing contact pins and a soft plastic sealing collar surrounding the inner part.

7 Claims, 3 Drawing Sheets

WATERPROOF HOUSING WITH A PLUG-AND-SOCKET CONNECTION FOR PROTECTION ELECTRONIC CIRCUIT

CROSS-REFERENCE TO RELATED APPLICATION

This application is a Continuation of International Application Ser. No. PCT/DE95/00928, filed Jul. 14, 1995.

BACKGROUND OF THE INVENTION

FIELD OF THE INVENTION

The invention relates to a waterproof housing with a plug-and-socket connection for protecting electronic circuits, having an upper part, a lower part and a seal disposed between the upper part and the lower part.

Electronic circuits in the interior of such a housing are connected to further circuits, for example a power supply or a signaling circuit, through contact pins leading outward. The contact pins are led outwards through a plug part disposed on the housing. An electrically conductive connection between the electronic circuit and the further circuits is produced by plugging a mating connector into the plug part. While being used, for example in motor vehicles, the electronic circuits must be protected by the housing against external influences, in particular against the intrusion of water. In that case, the plug part and the joint between an upper part and a lower part of the housing are weak points of the housing.

A housing with a plug-and-socket connection, which is known from German Published, Non-Prosecuted Patent Application DE 37 28 456 A1, has two housing parts, an upper part and a lower part, as well as an electronic circuit in the interior of the housing. The two housing parts are screwed to one another. A seal which is in the form of a sealing ring and is inserted into a depression in the lower part is disposed at the joint between the upper part and lower part. An opening in the upper part has a plug part which is screwed to the upper part and has contact pins, with a further sealing ring being disposed between the plug part and upper part.

SUMMARY OF THE INVENTION

It is accordingly an object of the invention to provide a waterproof housing with a plug-and-socket connection for protecting electronic circuits, which overcomes the hereinafore-mentioned disadvantages of the heretofore-known devices of this general type, which has a reliable seal against environmental influences, particularly in the vicinity of a plug part, which is intended to have as few individual parts as possible and which is economical to produce.

With the foregoing and other objects in view there is provided, in accordance with the invention, a waterproof housing with a plug-and-socket connection for protecting electronic circuits, comprising a hard plastic upper part; a hard plastic lower part; a soft plastic extruded or molded seal disposed between the upper part and the lower part replaces a separate sealing element; and a plug part having a hard plastic inner part constructed in one piece with one of the upper and lower parts, contact pins embedded in the inner part for producing an electrically conductive connection to an electronic circuit in the interior of the housing, and a soft plastic sealing collar surrounding the inner part.

The plug part is therefore sealed against the housing without an additional sealing element. A mating connector made from hard plastic bears tightly against the sealing collar of the plug part when introduced into the plug part, with the result that the plug-and-socket connection itself is reliably sealed against the intrusion of water. The housing components made from hard and soft plastics are produced in the same injection mold.

In accordance with another feature of the invention, the sealing collar widens outward, for example in the shape of a cone, so that a mating connector which is to be connected can easily be introduced. If the mating connector is not pushed completely into the plug part, it falls out of the plug part by virtue of the conical shape of the sealing collar. It is therefore possible to check whether or not the mating connector has been pushed in completely. In addition, the sealing collar and the outer shape of the mating connector can be configured in such a way that a false poling of the contact pins is impossible.

In accordance with a further feature of the invention, the sealing collar has a plurality of sealing lips.

In accordance with an added feature of the invention, if the housing is installed, for example, in a motor vehicle, the repulsion of water can be assisted by so-called drip noses on the outer wall of the housing. The water drips off the drip nose and does not run as far as the joint between the housing parts. The drip noses are configured in a rotary fashion so that they are effective irrespective of the direction of installation of the housing.

In accordance with an additional feature of the invention, there is provided a housing interior, a printed circuit board disposed in the interior, and inclined flexible pins holding the printed circuit board and fitted on one of the parts.

In accordance with yet another feature of the invention, there is provided a guide part for a mating connector having an outer periphery and hard plastic sealing lips on the outer periphery.

In accordance with a concomitant feature of the invention, the seal and the sealing collar of the plug part are constructed in one piece.

Other features which are considered as characteristic for the invention are set forth in the appended claims.

Although the invention is illustrated and described herein as embodied in a waterproof housing with a plug-and-socket connection for protecting electronic circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
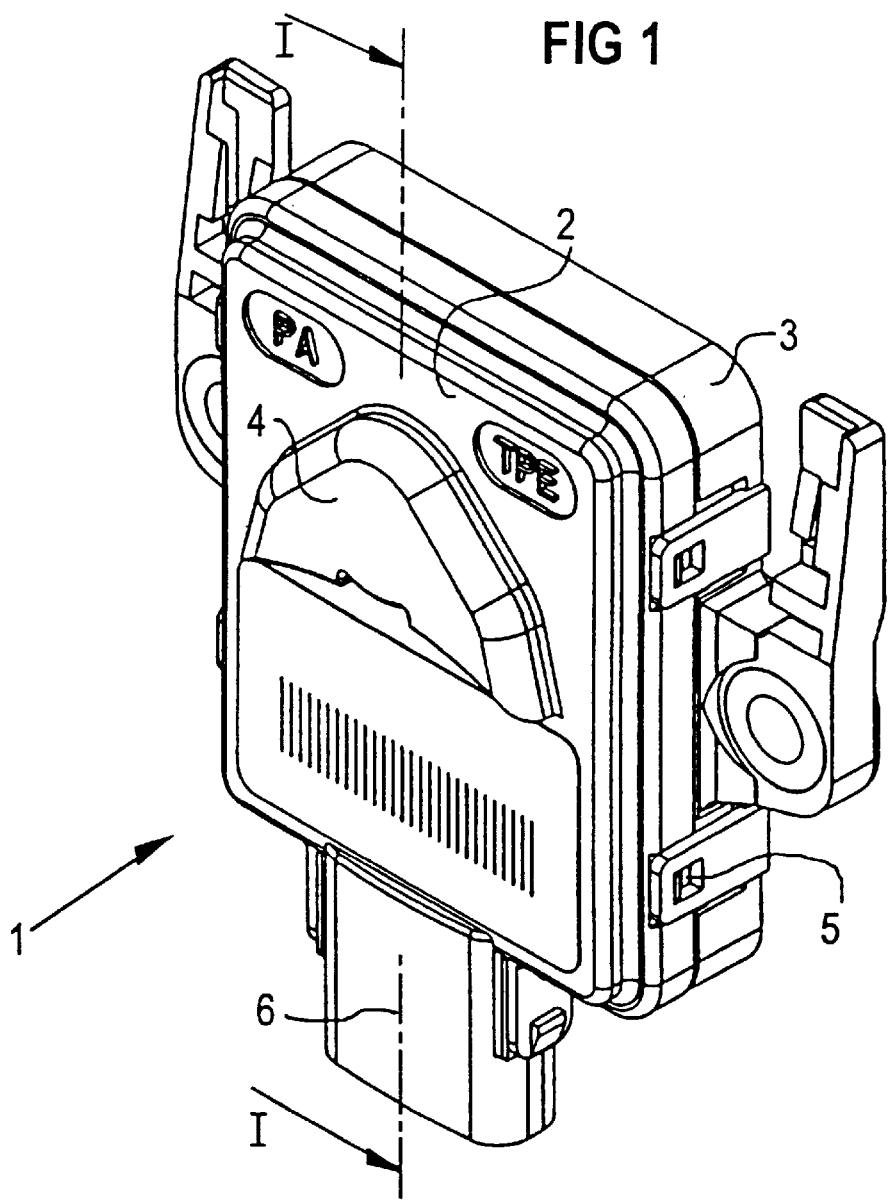
FIG. 1 is a perspective view of a housing according to the invention.

Referring now to the figures of the drawings in detail and first, particularly, to FIG. 1 thereof, there is seen a housing 1 according to the invention with an upper part 2 and a lower part 3. The upper part 2 has a drip nose 4. The drip nose 4 is rotary and as a result it repels drips, for example in a vehicle, irrespective of the direction of installation of the housing 1. The upper part 2 and lower part 3 of the housing 1 are connected to one another through snap locks 5. The upper part 2 has a plug part 6 for receiving a mating connector.

Figure 2:
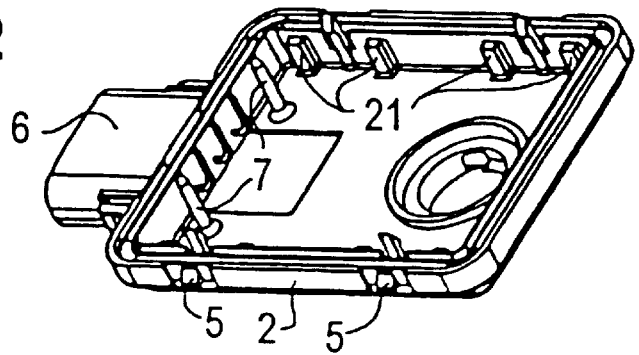
FIG. 2 is a perspective view of an upper part of the housing.

FIG. 2 shows a perspective view of the lower part 3 of the housing 1 according to FIG. 1. A printed circuit board with electronic components can be disposed between plate bearings 21 and pins 7 disposed in the interior of the lower part 3. Furthermore, FIG. 2 shows the plug part 6 disposed on the lower part of the housing.

Figure 3:
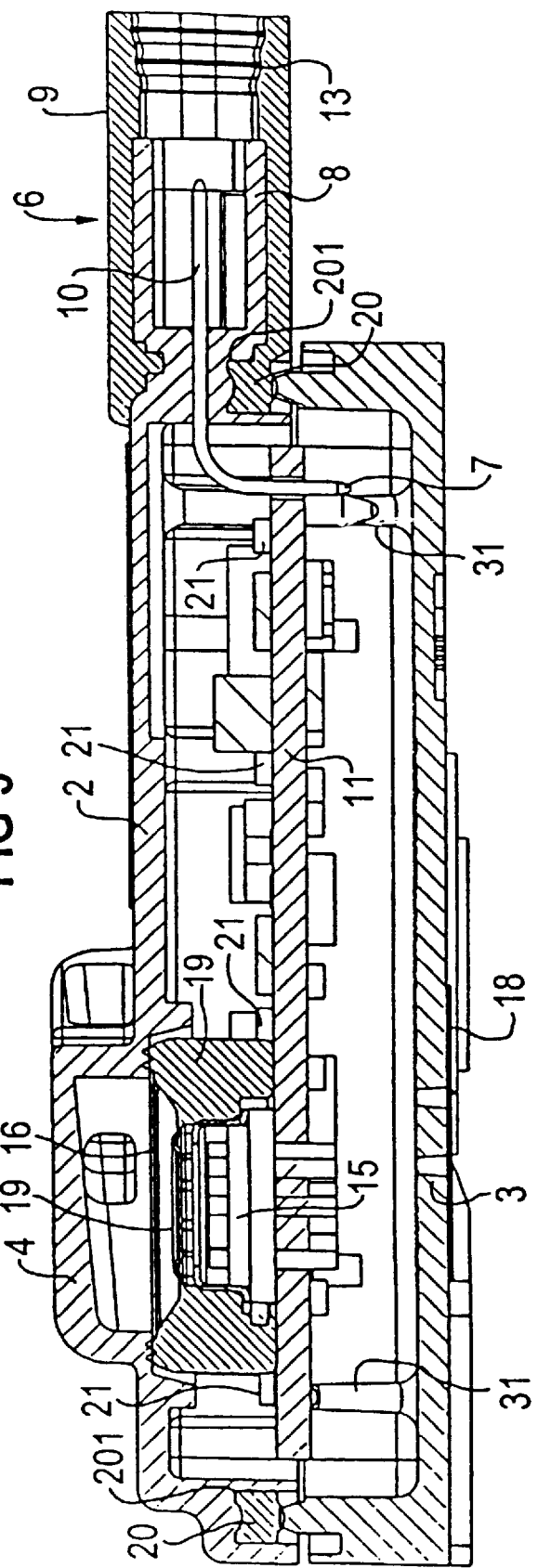
FIG. 3 is a longitudinal-sectional view of the housing, which is taken along a line I—I of FIG. 1, in the direction of the arrows.

FIG. 3 shows a longitudinal section through a closed housing 1 with the upper part 2 and the lower part 3. An inner part 8 of the plug part 6 is constructed in one piece with the upper part 2 of the housing 1. The inner part 8 is produced from the same hard plastic as the upper part 2 and the lower part 3. Contact pins 10, which lead to a printed circuit board 11, are embedded permanently in the hard inner part 8 of the plug part 6. Supports 31 carry the printed circuit board 11.

Figure 4:
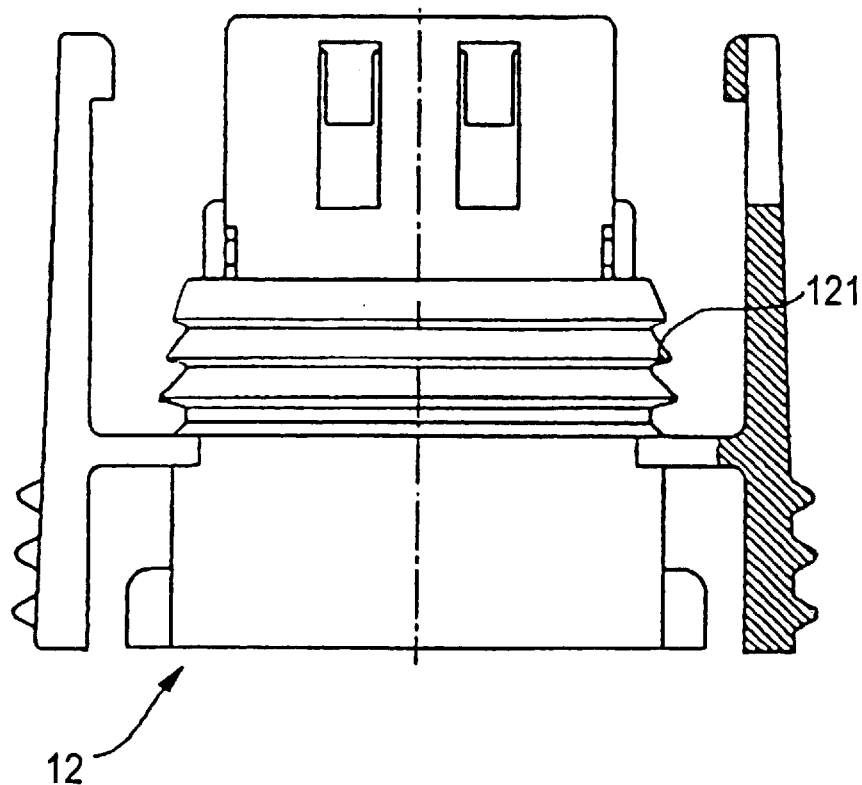
FIG. 4 is a longitudinal-sectional view of a mating connector for the plug part of the housing.

A sealing collar 9 made from a softer plastic surrounds the inner part 8. The cross section of the sealing collar 9 widens conically in the form of sealing lips 13 fitted in stages. A guide part 12 shown in FIG. 4 for mating connectors is manufactured from hard plastic and has sealing lips 121 on its periphery which engage in corresponding structuring or formations of the sealing lips 13 of the sealing collar 9 and ensure a good seal.

A seal 20 made from softer plastic is integrally formed in a groove 201 shown in FIG. 3 which forms the joint between the upper part 2 and the lower part 3 of the housing.

FIG. 3 also shows a silicon chip 15 surrounded by a covering 19, a perforation 16 in the upper part 2 and a closure or shield 18.

We claim:

1. A waterproof housing with a plug-and-socket connection for protecting electronic circuits, comprising:

a hard plastic upper part;

a hard plastic lower part;

a soft plastic extruded seal disposed between said upper part and said lower part; and a plug part having a hard plastic inner part constructed in one piece with one of said upper and lower parts, contact pins in said inner part, and a soft plastic sealing collar surrounding said inner part.

2. The housing according to claim 1, wherein said soft plastic sealing collar of said plug part widens outward conically.

3. The housing according to claim 1, wherein said sealing collar has a plurality of sealing lips.

4. The housing according to claim 1, including a drip nose disposed on an outside of the housing.

5. The housing according to claim 1, including a housing interior, a printed circuit board disposed in said interior, and inclined flexible pins holding said printed circuit board and fitted on one of said upper and lower parts.

6. The housing according to claim 1, including a guide part for a mating connector having an outer periphery and hard plastic sealing lips on said outer periphery.

7. The housing according to claim 1, wherein said seal and said sealing collar of said plug part are constructed in one piece.

* * * * *

UNITED STATES PATENT AND TRADEMARK OFFICE
CERTIFICATE OF CORRECTION

PATENT NO : 5,814,765
DATED : September 29, 1998
INVENTOR(S) : Peter Bauer et al.

It is certified that error appears in the above-identified patent and that said Letters Patent is hereby corrected as shown below:

On the title page, Item [54], and Column 1 Lines 1-3, the title should read as follows:

WATERPROOF HOUSING WITH A PLUG-AND SOCKET CONNECTION FOR PROTECTING ELECTRONIC CIRCUITS

Item [63] should read as follows:

Continuation of PCT/DE95/00928, July 14, 1995

Item [30] should read as follows:

July 28, 1994  [DE] Germany      P 44 26 812.2

Signed and Sealed this

Eleventh Day of May, 1999

*Attest:*

Q. TODD DICKINSON

*Attesting Officer*   *Acting Commissioner of Patents and Trademarks*